United States Patent
De Foucauld et al.

(10) Patent No.: US 8,902,014 B2
(45) Date of Patent: Dec. 2, 2014

(54) AUTOMATIC IMPEDANCE MATCHING METHOD FOR RADIOFREQUENCY CIRCUIT AND MODULAR EMISSION OR RECEPTION CHAIN

(75) Inventors: Emeric De Foucauld, Voiron (FR);
Jean-Baptiste David, Grenoble (FR);
Majid El Kaamouchi, Villecresnes (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 426 days.

(21) Appl. No.: 13/441,149

(22) Filed: Apr. 6, 2012

(65) Prior Publication Data

US 2012/0256698 A1    Oct. 11, 2012

(30) Foreign Application Priority Data

Apr. 7, 2011   (FR) ...................................... 11 53035

(51) Int. Cl.
*H03H 7/38*    (2006.01)
*H04B 1/04*    (2006.01)
*H04B 1/18*    (2006.01)

(52) U.S. Cl.
CPC ............... *H04B 1/0458* (2013.01); *H03H 7/38* (2013.01); *H04B 1/18* (2013.01)
USPC ........................................... 333/17.3; 333/32

(58) Field of Classification Search
USPC ............................................. 333/32, 33, 17.3
See application file for complete search history.

(56) References Cited

U.S. PATENT DOCUMENTS

| 4,612,669 A | 9/1986 | Nossen |
| 6,192,318 B1 * | 2/2001 | Yogo et al. ....................... 702/65 |
| 2008/0081581 A1 | 4/2008 | Rofougaran |
| 2009/0066440 A1 | 3/2009 | Chan Wai Po et al. |
| 2011/0053524 A1 | 3/2011 | Manssen et al. |

FOREIGN PATENT DOCUMENTS

WO    96/39727 A1    12/1996

OTHER PUBLICATIONS

E.L. Firrao, "An Automatic Antenna Tuning System Using only RF Signal Amplitudes", IEEE Transactions on Circuits and Systems II, Express Briefs, Sep. 1, 2008, pp. 833-837, vol. 55, No. 9, IEEE, USA, XP011232645.

Andre Van Bezooijen, et al., "Adaptive Impedance-Matching Techniques for Controlling L Networks", IEEE Transactions on Circuits and Systems I, Regular Papers, Feb. 1, 2010, pp. 495-505, vol. 57, No. 2, IEEE USA, XP011333613.

* cited by examiner

*Primary Examiner* — Stephen Jones
(74) *Attorney, Agent, or Firm* — Baker & Hostetler

(57) ABSTRACT

As relates to the automatic impedance matching of a radiofrequency system, a system comprises three modules. In a matching phase a matching computation module is connected in a detachable manner between an amplification module and an antenna module containing an antenna, a matching impedances network, and memory means for storing control data of the network; then a matching computation is carried out; the computation module supplies control data of the network to the memory device. In a phase of using the system, the second module is removed and the antenna module is connected in a detachable manner directly to the amplification module, the matching network being controlled by the stored control data, which correspond to the desired impedance matching.

9 Claims, 2 Drawing Sheets

AUTOMATIC IMPEDANCE MATCHING METHOD FOR RADIOFREQUENCY CIRCUIT AND MODULAR EMISSION OR RECEPTION CHAIN

CROSS-REFERENCE TO RELATED APPLICATION

This application claims priority to foreign French patent application No. FR 1153035, filed on Apr. 7, 2011, the disclosure of which is incorporated by reference in its entirety.

FIELD OF THE INVENTION

The invention relates to the production of an automatic impedance matching circuit for a radiofrequency antenna.

BACKGROUND

In certain radiofrequency data transmitting applications, it has been observed that the transmitting or receiving antenna could have an impedance strongly dependent on conditions external to the antenna, and notably dependent on the environment in which the antenna is placed.

For example, in medical telemetry, it can happen that the antenna is inserted in a probe placed in a human body and the impedance then strongly depends on the biological environment in which the antenna is located. It depends on electrical properties (conductivity, dielectric constant) of the surrounding tissues (muscles, fat) or of the liquid environment (blood, other liquids) in which the antenna can be immersed.

Even in more conventional radiofrequency transmission applications (mobile telephony, etc.) the impedance of the antenna can vary as a function of the environment in which the user is located.

A transmitting (or respectively receiving) system comprises at least one amplifier with which can be associated one or more filters and an antenna (at the output of the amplifier for a transmitting system and at the input of the amplifier for a receiving system).

In general, the antenna impedance variations are particularly sensitive for very small antennas having a high quality factor, used in applications having severe miniaturization constraints.

These impedance variations can result in losses called mismatch losses: these losses result from the fact that the transmitting system which feeds the antenna, or the receiving system which receives a signal from the antenna, is generally designed to have optimum performance when it is loaded (at the output for the transmitting system or at the input for the receiving system) by a well-defined nominal impedance; it has degraded performance when it is loaded by an impedance different from its nominal value. The mismatch losses can be as high as 40 dB.

That is why it has already been tried to interpose, between the output of the amplifier and the transmitting antenna (and this could also be done at the input for a receiving antenna), an impedance matching network, which means that the amplifier sees an impedance different from that of the antenna and preferably equal to the nominal value for which it was designed, for example 100 ohms or 500 ohms. The matching network can be tuned, that is to say its capacitive and/or inductive components have variable values to take account of the environmental conditions of the antenna such that the matching is the best possible whatever the circumstances may be.

In Patent Application US 2009-0066440, there was proposed an automatic impedance matching method in a transmitting or receiving system, in which both the amplitude and the phase of the current and of the voltage at the output of the transmitting system (or at the input of the receiving system) are detected. The ratio between the voltage and the current is representative of the load impedance Zm seen by the system loaded with the assembly formed by the matching network and the antenna of impedance $Z_{ant}$. The load impedance Zm is measured and the antenna impedance $Z_{ant}$ is computed from the measured load impedance Zm and the impedances of the matching network whose configuration at the time of measurement is known, and finally the modification which must be applied to one or more of the impedances of the matching network is computed in order to result in the impedance seen by the amplifier becoming matched to the nominal impedance of the amplifier in the actual environmental conditions of the antenna.

This matching method has the considerable advantage, in comparison with older methods, of allowing a matching without iterative computation. A single measurement suffices in order to carry out the matching. It does, however, necessitate a large amount of circuitry and computing means. This circuitry and these computing means prove to be costly and bulky, while in a certain number of applications it is not necessary to use them more than once or a few times.

The object of the invention is to reduce the cost of industrial implementation of automatic impedance matching methods in transmitting and receiving systems which necessitate such a matching operation infrequently.

SUMMARY OF THE INVENTION

According to the invention, there is proposed an impedance matching method, for a transmitting or receiving system, comprising the following steps:
  connecting, in a detachable manner, a first module of the system, containing an amplifier, to a second module containing impedance matching computation means;
  connecting, in a detachable manner, a third module to the second module, whilst the second module is connected to the first one, the third module containing an antenna, a matching impedances network and memory means for storing control data of the impedances network,
  carrying out a matching computation in the second module whilst it is thus connected in a detachable manner between the first and third modules, and providing, by the second module to the third module, control data for the matching network, resulting from this computation,
  storing the control data in the memory means of the third module,
  removing the second module and connecting, in a detachable manner, the third module to the first module in such a way as to connect the amplifier to the antenna through the matching network, the latter then being controlled by the stored control data.

Thus, the transmitting or receiving system normally operates with the first module connected directly to the third module. It is only for an isolated impedance matching operation that the second module will be interposed between the first and third modules. A single second module can be used in turn for tens or hundreds of first and third modules when it is necessary to carry out the desired impedance matching, the system comprising only two modules except for during matching adjusting operations.

In order to implement this method, the invention proposes a radiofrequency transmitting or receiving system comprising at least one amplifier, an antenna and a matching impedances network disposed between the amplifier and the antenna, this system being characterized in that it comprises an amplification module and an antenna module, the amplification module containing the amplifier and at least a first connector for a detachable connection to the antenna module, the antenna module containing the antenna, the matching impedances network, at least a first connector cooperating with the first connector of the amplification module for transmitting radiofrequency signals from the amplification module to the antenna module, memory means for the permanent storage of control data allowing a control of the impedances of the network in order to give these impedances desired values, and at least a second connector allowing a detachable connection of the antenna module with the exterior in order to receive from the exterior control data to be stored.

The amplification module also comprises a connector (preferably another connector but exceptionally the same connector) connected in a detachable manner to a connector of the antenna module for an electrical power supply of the antenna module by the amplification module. This is only so in the case where the antenna module requires an electrical power supply for its operation. This point will be returned to later.

During an impedance matching operation, this system configuration is modified by the insertion, between the amplification module and the antenna module, of an impedance matching computation module. For this purpose, the impedance matching computation module comprises:

a first connector connected in a detachable manner to the first connector of the amplification module for the transmission of radiofrequency signals from the amplification module to the computation module, a second connector connected in a detachable manner to the first connector of the antenna module, for the transmission of radiofrequency signals from the computation module to the antenna module, a third connector connected in a detachable manner to the second connector of the antenna module, means for computing matching impedance values as a function of the impedance of the antenna and in order to provide corresponding control data to the memory means through the third connector of the computation module and the second connector of the antenna module.

The amplification module also comprises a connector (preferably a second connector but exceptionally the same connector) for the detachable connection to a connector of the computation module in order to provide an electrical power supply to the latter. Preferably, it also comprises a connector for the detachable connection to a connector of the antenna module in order to provide an electrical power supply to the latter. The connector of the antenna module for its electrical power supply is preferably directly connectable to the corresponding connector of the amplification module for the direct electrical power supply of the antenna module by the amplification module.

Consequently, the first connector of the antenna module is preferably identical to the first connector of the computation module; similarly, the first connector of the amplification module is preferably identical to the second connector of the computation module.

The storage of the computed data can be carried out by magnetic actuating and magnetic holding switches, which do not require any energy source for the retention and use of the data. It can also be done by fuses (but can then only be done once), or by an Electrically Erasable Programmable Read-Only Memory (EEPROM); in this latter case, it is necessary for the third module to have an electrical power supply in order that the information in the memory can be extracted from it and applied as control data to the matching network. This power supply can be provided by the first module when it is connected directly to the third one, but provision can also be made for the third module to be provided with an autonomous power supply, battery cell or cells.

The matching network can be constituted by a simple circuit with three reactive impedances in T or Pi configuration, for example one capacitor and two inductors or, better, one inductor and two capacitors. At least one of these impedances is variable but in practice two of the impedances will be variable Preferably, two variable capacitors and one fixed inductor will be used considering that it is easier to produce variable capacitors than variable inductors. The variable impedances are preferably produced in the form of several elementary impedances in series and/or in parallel and individually switchable by an electronic control.

BRIEF DESCRIPTION OF DRAWINGS

Other features and advantages of the invention will appear on reading the following detailed description which is given with reference to the appended drawings, in which.

DETAILED DESCRIPTION

In the following detailed description, it will systematically be considered that the antenna is a transmitting antenna fed by the output of an amplifier. The amplifier is designed to operate in an optimum manner when the load placed on its output has a nominal impedance $Z_{opt}$ and when the operating frequency is f, corresponding to an angular frequency $\omega=2\pi.f$. At high frequency, the impedance $Z_{opt}$ will generally be complex. The invention is applicable in the same way if the antenna is a receiving antenna connected to the input of an amplifier designed to operate in an optimum manner when the impedance connected to its input is a nominal impedance $Z_{opt}$ and when the operating frequency is f.

Figure 1:
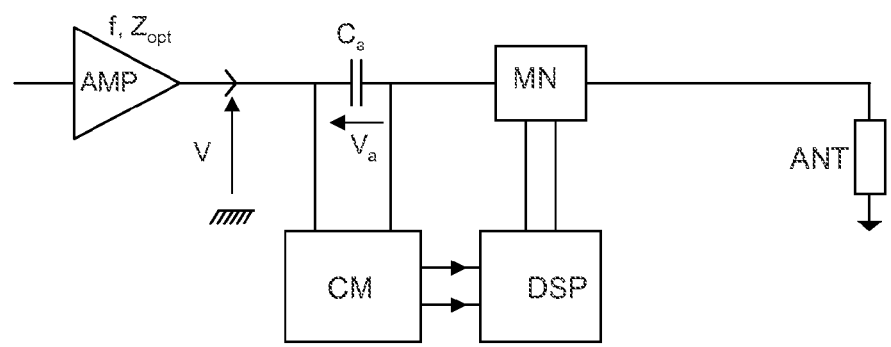
FIG. 1 shows the general constitution of a radiofrequency transmitting circuit comprising automatic impedance matching means.

FIG. 1 shows a block diagram of a radiofrequency transmitting circuit, with an amplifier AMP working at the transmitting carrier frequency f, an antenna ANT fed by the amplifier, a matching network MN inserted in series between the output of the amplifier AMP and the antenna ANT. This diagram could also include a filter between the amplifier AMP and the network MN and/or a filter between the network MN and the antenna.

The matching network MN is included in an automatic impedance matching circuit whose function is to act such that the load impedance of the amplifier is equal to the optimum impedance $Z_{opt}$ of the amplifier or as close as possible to this optimum impedance. The load of the amplifier is essentially constituted by the network MN, which is itself loaded by the antenna ANT.

In addition to the network MN, the matching circuit comprises:

a measuring impedance placed in series between the output of the amplifier and the matching network MN; it is used for measuring the current i which comes out of the amplifier; this impedance is preferably a simple capacitor $C_a$ of impedance $1/j.C_a.\omega$); the voltage across its terminals is a voltage $v_a=i/j.C_a.\omega$; the current is $i=j.v_a.C_a.\omega$;

a circuit CM for measuring the voltage $v_a$ across the terminals of the measuring impedance and the voltage V at the output of the amplifier (or at the input of the matching network loaded by the antenna) as complex values, that is to say including the value of the phase difference between these voltages;

computation means DSP which make it possible to compute mathematically, from these complex values $v_a$ and V, what impedance values have to be given to the impedances of the matching network MN in order to achieve matching between the output impedance of the amplifier and the impedance of the load applied to that output.

The computation means DSP provide, directly or by the intermediary of a logic control circuit, control signals for switches, which are not shown and are part of the network MN and which establish the desired impedance values for each impedance of that network.

Patent Publication US2009-0066440 describes the way in which the matching circuit operates. In brief, the computation means DSP compute the modulus and the argument of the impedance Zm=V/i of the actual load of the amplifier from the voltage V and from the current i, the latter being obtained from the voltage $V_a$; from these, they calculate the real and imaginary parts of the vectorial impedance Zm; they calculate the effective impedance of the antenna $Z_{ant}$ from these values and from the known actual impedance values of the various impedances Z1, Z2, etc. which constitute the matching network MN; they calculate one or more modified impedance values Z'1, Z'2 of the matching network MN from a desired value $Z_{opt}$ of the load impedance of the amplifier and from the calculated antenna impedance $Z_{ant}$ and, finally, they supply the network MN with the appropriate control signals to give the impedances Z1, Z2, etc. of that network the modified values Z'1, Z'2, etc. thus calculated. The transmitting and receiving system is matched when the impedances of the matching network assume these calculated values Z'1, Z'2, etc.

According to the invention, provision is made to constitute the transmitting (or receiving) system according to two possible configurations, using three modules that can be connected together in a detachable manner. These modules are respectively an amplification module (comprising a transmitting amplifier or a receiving amplifier depending on the case), a matching computation module and an antenna module comprising an antenna and a matching impedances network. These modules are provided with connectors making it possible to connect the amplification module to the antenna module in a detachable manner either with the interposition of the matching computation module between the antenna module and the amplification module, during an impedance matching operation, or directly, after the matching operation.

The connectors and connections referred to in this description are direct electrical contact connectors and connections.

Figure 2:
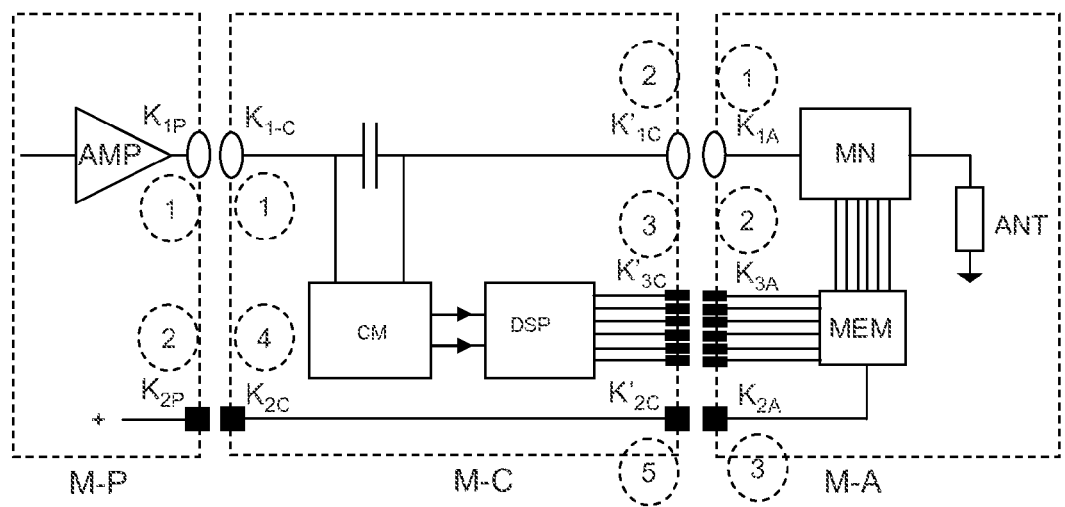
FIG. 2 shows the modules of a radiofrequency transmitting system according to the invention.

FIG. 2 shows the three possible modules of this system, which in this case is a transmitting system. The modules would be the same for a receiving system, but the amplification module would be connected to the other modules on the input side of the amplifier and not the output side.

The amplification module M-P contains circuits for producing the radiofrequency signal which it is desired to transmit from the antenna, and in particular, at the output of the module, a power amplifier operating at radiofrequency. Only the output amplifier of the module is shown.

The antenna module M-A comprises not only an antenna ANT but also an electrically controllable matching impedances network MN associated with a memory device MEM. The memory device stores the control data of the network of impedances, that is to say data which, when they are applied to the network MN, impose well-defined values (those which have been determined by the matching computation module in a matching computation phase) on the impedances of the network.

Preferably, the matching network MN comprises impedances that are controllable by logic signals and the memory device is a logic signals memory. For example, the memory stores binary information used for controlling switches forming part of the network MN, these switches acting on the value of the impedance components with which they are associated. For example, a switch connects a capacitive component in parallel with other capacitive components in order to modify the value of the set of capacitors in parallel.

The memory MEM can be a permanent memory, storing definitive information, or a reprogrammable memory. It can be constituted in the first case for example by fuses. In the second case it can be an EEPROM memory and in this case it is necessary to provide an electrical power supply for this memory both during its programming and while it is being read. The memory can also be constituted by a set of magnetically operated and magnetically held components (switches) and, in this case, it is not necessary to provide an electrical power supply for its operation either during the matching computation phase or during the operating phase of the system.

The matching computation module M-C comprises the components that are necessary for the computation of the impedance values that have to be given to the network MN in order to achieve the impedance matching. It therefore essentially comprises, in the case in which the computation is carried out as described above, the measuring impedance $C_a$, the measuring circuit CM which measures the voltages across the terminals of the measuring impedance and at the output of the amplifier (or at the input of the antenna module) and which converts them into digital values, and the digital processor DSP which carries out the computations and which produces control signals for the memory device MEM for giving the computed values to the impedances of the network.

The amplification module M-P comprises two connectors $K_{1P}$ and $K_{2P}$ intended to be connected to the matching computation module M-C. The matching computation module M-C therefore comprises two corresponding connectors $K_{1C}$ and $K_{2C}$ which cooperate with the connectors $K_{1P}$ and $K_{2P}$ respectively in order to establish the sought connection.

The numbers in the dotted circles in the figures represent the numbers of the connectors of each module, the first connector of a module bearing the number 1, the second bearing the number 2, etc.

The connectors $K_{1p}$ and $K_{1c}$ are radiofrequency connectors, for example coaxial connectors.

The connectors $K_{2P}$, $K_{2C}$ are power supply connectors intended to transmit from the amplification module M-P to the matching computation module M-C the electrical energy necessary for the operation of the latter (for example a DC supply voltage of about 3 volts, 5 volts or 12 volts).

Figure 4:
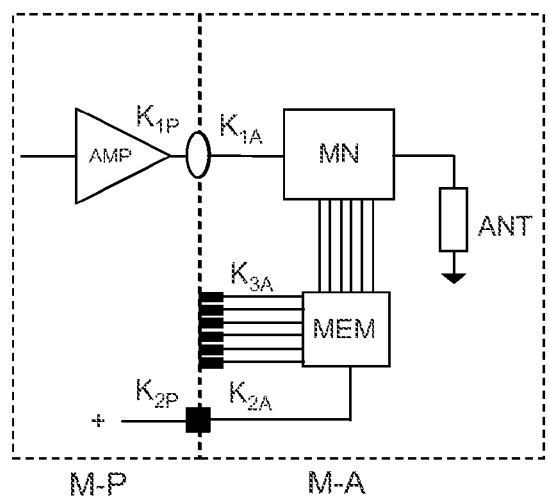
FIG. 4 shows a transmitting system according to the invention in a normal operating configuration where the impedance of the antenna module has previously been matched to the impedance of the amplifier.

The module M-C also comprises at least two connectors $K'_{1C}$ and $K'_{2C}$ for the connection with the antenna module M-A. The antenna module M-A therefore comprises two corresponding connectors $K_{1A}$ and $K_{2A}$ which cooperate with the connectors $K'_{1C}$ and $K'_{2C}$ in order to establish the connection between the modules M-C and M-A. Moreover, the connectors $K_{1A}$ and $K_{2A}$ are able to cooperate directly with the connectors $K_{1P}$ and $K_{2P}$ in order to establish a direct connection, as shown in FIG. 4, between the amplification module and the antenna module when the matching computation module is removed. The connectors $K'_{1C}$ and $K_{1A}$ are therefore radiofrequency connectors, for example coaxial connectors. The connectors $K_{2C}$ and $K_{2A}$ are power supply connectors.

In practice, the connector $K'_{1C}$ is identical to the connector $K_{1P}$ since both must fit the connector $K_{1A}$; and, similarly, the connector $K'_{2C}$ is identical to the connector $K_{2P}$ since both must be able to fit the connector $K_{2A}$.

The power supply connectors $K'_{2C}$ and $K_{2A}$ are, however, optional; they are present if the antenna module requires an external power supply in order to operate and, in particular, if the memory device MEM requires a power supply in order to provide the matching network with the stored data but has no autonomous power supply. However, if the memory device MEM has an autonomous power supply (battery cell or cells) or if it does not require a power supply in order to operate, either in writing or in reading, the connectors $K'_{2C}$ and $K_{2A}$ are not necessary.

Finally, the matching computation module comprises a connector $K'_{3C}$ for the transmission of the control data to be stored in the memory device MEM. The connector is preferably a connector designed to transmit logic signals, the control data for the matching impedances network preferably being transmitted in binary form. The connector $K'_{3C}$ can be a multiple connector for a transmission of logic signals in parallel, or a single connector if the data signals are transmitted in series.

The antenna module M-A comprises a multiple or single connector $K_{3A}$ cooperating with the connector $K'_{3C}$ in order to receive the signals transmitted by the latter and in order to transmit them to the memory device MEM.

Earth connections making it possible to establish a common earth potential for the three modules have not been shown explicitly in FIG. 2; this connection is generally part of the power supply connectors or of the coaxial connectors, or even of the logic signals connectors.

Moreover, throughout this description a distinction has been made in the figures between the power supply connectors and the radiofrequency signals connectors but it can happen that these connectors are merged as, in certain cases, the same connector can transmit both a radiofrequency signal and a DC power supply voltage superimposed on the radiofrequency signal. Hereafter, it is assumed, in order to simplify the explanations, that the radiofrequency signals connectors are separate from the power supply connectors as shown in FIG. 2.

Figure 3:
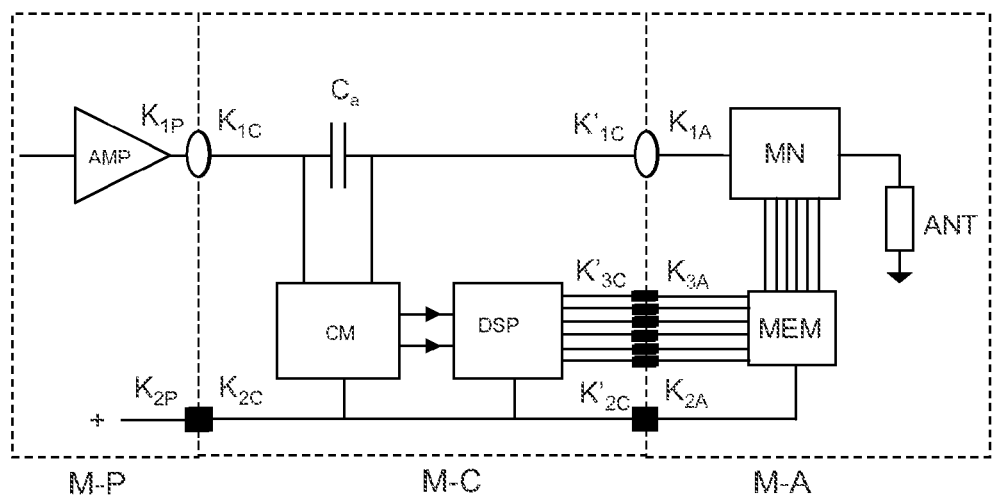
FIG. 3 shows a transmitting system according to the invention in its configuration allowing automatic impedance matching.

FIG. 3 shows the transmitting system according to the invention in its three-module configuration, the configuration which is used when it is desired to carry out an impedance matching computation.

The connectors $K_{1P}$ and $K_{2P}$ of the amplification module are engaged with the connectors $K_{1C}$ and $K_{2C}$ of the computation module. The connectors $K'_{1C}$, $K'_{2C}$ (if the latter exists), $K'_{3C}$ of the computation module are engaged with the connectors $K_{1A}$, $K_{2A}$ (if the latter exists), $K_{3A}$ of the antenna module.

The measuring circuit CM measures the potentials (which are complex, taking account of the phase difference) at the terminals of the measuring capacitor $C_a$ and converts them into digital form. The frequency of the measured signals can be the normal working frequency of the system or a frequency specially dedicated to the impedance computation. In both cases, the measuring circuit can comprise frequency-changing circuits allowing measurement at a frequency lower than the working frequency.

The digital values gathered make it possible to compute the impedance Zm of the load connected to the amplifier AMP. This load is constituted by the measuring impedance (the capacitor $C_a$) in series with the impedance of the antenna module, this latter impedance being that of the assembly formed by the matching network loaded by the antenna.

On the basis of the complex impedance Zm, the real and imaginary parts of the impedance of the antenna $Z_{ant}$ can be computed, knowing the actual impedance of the matching network. The latter impedance is related biunivocally to the control data stored in the memory device. These data are placed in memory by the computing processor DSP and are therefore known by that processor. It can be imagined, for example, that the computation begins with a placing into memory of predetermined initial control data.

Knowing the actual impedance $Z_{ant}$ of the antenna, it is possible to compute the impedances which must be placed in the matching network MN so that the assembly of the network MN and the antenna ANT in series has an optimum overall impedance $Z_{opt}$ as a load for the amplifier. It is the structure of the amplifier which determines what this optimum impedance is. The computation takes the impedance of the measuring capacitor $C_a$ into account. The processor DSP computes the necessary impedance values and transmits them in the form of control data (preferably binary) on the connector $K'_{3C}$. These data are placed in permanent memory in the memory device MEM and consequently modify the impedances of the matching network.

Once this determination of impedance is complete and the result is stored in the antenna module, the computation module M-C can be removed.

The transmitting system then takes on its normal operating configuration, which is shown in FIG. 4. The antenna module M-A is directly connected to the amplification module M-P through the radiofrequency connectors $K_{1A}$ and $K_{1P}$.

The connectors $K_{2P}$ and $K_{2A}$, if they exist, are also engaged, in the case where the memory device needs an electrical power supply in order to control the matching network MN.

The connector $K_{3A}$ is not connected to a connector of the amplification module in this system configuration.

The impedance of the network MN loaded by the antenna has the optimum value $Z_{opt}$ because the data stored in the memory device MEM impose on the impedances of the network the values which achieve this result.

It will be noted that the optional power supply connectors $K'_{2C}$ and $K_{2A}$ can be specific power supply (and earth) pins incorporated in the connectors $K'_{3C}$ and $K_{3A}$.

Figure 5:
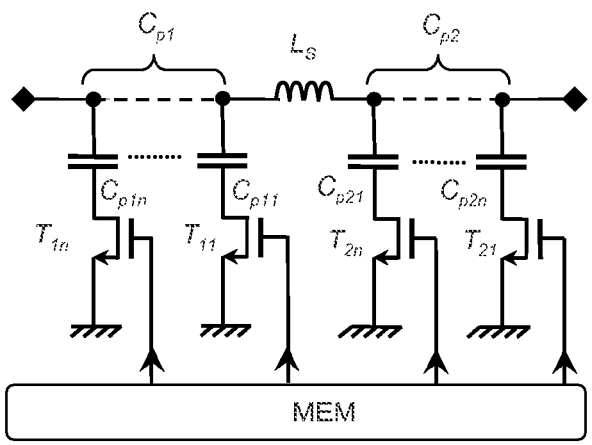
FIG. 5 shows an example of a matching impedances network.

FIG. 5 shows an example of a matching impedances network able to be controlled by an EEPROM memory. The network is a Pi network with one inductor $L_s$ in series between two capacitors $C_{p1}$ and $C_{p2}$ in parallel. The capacitor $C_{p1}$ is constituted by several capacitors in parallel, $C_{p11}$, $C_{p12}$, ... $C_{p1n}$, able to be connected or disconnected individually under the control of the memory device. A switch constituted by a transistor $T_{11}$ to $T_{1n}$ respectively is placed in series with each capacitor. The capacitor $C_{p1}$ can assume a set of possible values depending on the capacitor or capacitors that are connected at a given time. The individual capacitors can each correspond to a respective binary significance in order to easily obtain $2^n$ values with n capacitors. The capacitor $C_{p2}$ is constituted like the capacitor $C_{p1}$.

The invention claimed is:

1. A radiofrequency transmitting or receiving system comprising at least one amplifier, an antenna and a matching impedances network disposed between the amplifier and the antenna, the system further comprising:
an amplification module and an antenna module, the amplification module containing the amplifier and at least a first connector for a detachable connection to the antenna module, the antenna module containing the antenna, the matching impedances network, at least a first connector cooperating with the first connector of the amplification module for transmitting radiofrequency signals from the amplification module to the antenna module, memory means for the permanent storage of control data allowing a control of the impedances of the network in order to give these impedances desired values, and at least a second connector allowing a detachable connection of the antenna module with the exterior in order to receive from the exterior control data to be stored.

2. The system according to claim 1, wherein the amplification module comprises a connector connected in a detachable manner to a connector of the antenna module for an electrical power supply of the antenna module by the amplification module.

3. The system according to claim 1, wherein the memory means comprise an electrically erasable programmable read-only memory.

4. The system according to claim 1, wherein the memory means comprise magnetic actuating and magnetic holding switches, which do not require an electrical power supply for their operation.

5. The system according to claim 1, further comprising an impedance matching computation module, interposed between the amplification module and the antenna module, the impedance matching computation module comprising:
a first connector connected in a detachable manner to the first connector of the amplification module for the transmission of radiofrequency signals from the amplification module to the computation module,
a second connector connected in a detachable manner to the first connector of the antenna module for the transmission of radiofrequency signals from the computation module to the antenna module,
a third connector connected in a detachable manner to the second connector of the antenna module, and
means for computing matching impedance values as a function of the impedance of the antenna and in order to provide corresponding control data to the memory means through the third connector of the computation module and the second connector of the antenna module.

6. The system according to claim 5, wherein the amplification module comprises a connector for the detachable connection to a connector of the computation module in order to provide an electrical power supply to the latter.

7. The system according to claim 6, wherein the computation module comprises a connector for the detachable connection to a connector of the antenna module in order to provide an electrical power supply to the latter.

8. The system according to claim 7, wherein the connector of the antenna module for the electrical power supply is directly connectable to the electrical power supply connector of the amplification module for the direct electrical power supply of the antenna module by the amplification module.

9. An impedance matching method, for a transmitting or receiving system, comprising the following steps:
connecting, in a detachable manner, a first module containing an amplifier to a second module containing impedance matching computation means;
connecting, in a detachable manner, a third module to the second module, whilst the second module is connected to the first one, the third module containing an antenna, a matching impedances network and memory means for storing control data of the impedances network,
carrying out a matching computation in the second module whilst it is thus connected in a detachable manner between the first and third modules, and providing, by the second module to the third module, control data for the matching impedances network, resulting from this computation,
storing the control data in the memory means of the third module, and
removing the second module and connecting, in a detachable manner, the third module to the first module in such a way as to connect the amplifier to the antenna through the matching impedances network, the latter being controlled by the stored control data.

* * * * *